(12) United States Patent
Park et al.

(10) Patent No.: US 10,575,403 B2
(45) Date of Patent: Feb. 25, 2020

(54) DISPLAY DEVICE

(71) Applicant: Samsung Display Co., Ltd., Yongin-Si, Gyeonggi-Do (KR)

(72) Inventors: Sung-dong Park, Asan-si (KR); Youngdae Song, Busan (KR); Sehui Jang, Yongin-si (KR); Byoungdoo Jeong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/617,404

(22) Filed: Jun. 8, 2017

(65) Prior Publication Data

US 2018/0098427 A1 Apr. 5, 2018

(30) Foreign Application Priority Data

Oct. 5, 2016 (KR) .................. 10-2016-0128543

(51) Int. Cl.
*H05K 1/00* (2006.01)
*H05K 1/14* (2006.01)
(Continued)

(52) U.S. Cl.
CPC ........... *H05K 1/147* (2013.01); *G02F 1/1333* (2013.01); *H05K 1/0278* (2013.01); *H05K 1/0393* (2013.01); *H05K 1/142* (2013.01); *G06F 1/1616* (2013.01); *H01L 23/49572* (2013.01); *H04N 5/64* (2013.01); *H05K 1/028* (2013.01); *H05K 1/0277* (2013.01); *H05K 1/0283* (2013.01);
(Continued)

(58) Field of Classification Search
CPC .... H05K 1/0277; H05K 1/028; H05K 1/0283; H05K 1/147; H05K 1/189; H05K 2201/05; H05K 2201/051; H05K 2201/052; H05K 2201/055; H05K 2201/056; H05K 2201/057; H05K 2201/10681
USPC ......................................................... 361/749
See application file for complete search history.

(56) References Cited

U.S. PATENT DOCUMENTS

2005/0237467 A1 * 10/2005 Takaishi .............. G02F 1/13452 349/149
2008/0062349 A1 * 3/2008 Komori ............... G02F 1/13452 349/60
(Continued)

FOREIGN PATENT DOCUMENTS

KR 100247259 B1 3/2000
KR 1020050035970 A 4/2005
(Continued)

*Primary Examiner* — Binh B Tran
(74) *Attorney, Agent, or Firm* — Cantor Colburn LLP

(57) ABSTRACT

A display device includes a display panel, a main circuit board facing a rear surface of the display panel and including a first main segment, a second main segment, and a first sub-segment disposed between the first main segment and the second main segment, and flexible printed circuit boards which electrically connects the display panel and the main circuit board. A first cut-away portion is defined between the first main segment and the second main segment, the first main segment is bent along a first bending line defining a boundary between the first main segment and the first sub-segment, and the second main segment is bent along a second bending line defining a boundary between the second main segment and the first sub-segment.

21 Claims, 16 Drawing Sheets

(51) Int. Cl.
   *G02F 1/1333*   (2006.01)
   *H05K 1/02*   (2006.01)
   *H05K 1/03*   (2006.01)
   *H05K 5/00*   (2006.01)
   *H05K 7/00*   (2006.01)
   *G02F 1/1345*   (2006.01)
   *H01L 23/495*   (2006.01)
   *G06F 1/16*   (2006.01)
   *H04N 5/64*   (2006.01)
   *H05K 1/18*   (2006.01)

(52) U.S. Cl.
   CPC ......... *H05K 1/189* (2013.01); *H05K 2201/05* (2013.01); *H05K 2201/09145* (2013.01); *H05K 2201/10128* (2013.01); *H05K 2201/10681* (2013.01)

(56) References Cited

U.S. PATENT DOCUMENTS

| | | | |
|---|---|---|---|
| 2008/0231791 A1* | 9/2008 | Tanabe | G06F 3/0421 349/150 |
| 2015/0189768 A1 | 7/2015 | Kishida et al. | |
| 2015/0208522 A1 | 7/2015 | Kim et al. | |
| 2016/0057872 A1 | 2/2016 | Park et al. | |
| 2016/0066410 A1 | 3/2016 | Cho | |
| 2016/0205786 A1 | 7/2016 | Nam et al. | |
| 2016/0360607 A1* | 12/2016 | Li | H05K 1/028 |
| 2017/0374740 A1* | 12/2017 | Yamaguchi | G02F 1/1333 |

FOREIGN PATENT DOCUMENTS

| | | |
|---|---|---|
| KR | 100859039 B1 | 9/2008 |
| KR | 1020150018067 A | 2/2015 |

\* cited by examiner

DISPLAY DEVICE

This application claims priority to Korean Patent Application No. 10-2016-0128543, filed on Oct. 5, 2016, and all the benefits accruing therefrom under 35 U.S.C. § 119, the content of which in its entirety is herein incorporated by reference.

BACKGROUND

1. Field

The disclosure relates to a display device. More particularly, the disclosure relates to a display device curved along a center axis of a display panel.

2. Description of the Related Art

A display device typically includes a display panel that displays an image. The display panel includes gate lines, data lines, and pixels, each of which is connected to a corresponding gate line of the gate lines, and a corresponding data line of the data lines. The display device may further include a main circuit board to apply driving signals to the gate lines and the data lines. The main circuit board may be electrically connected to the display panel through a flexible printed circuit board.

In recent years, various display devices, such as a foldable display device, a curved display device, etc., have been developed. In such a foldable or curved display device, a main circuit board disposed on a surface of the display panel thereof has a curved structure corresponding to the curved shape of the display panel.

SUMMARY

In a foldable or curved display device, when the main circuit board is curved corresponding to the curved shape of the display panel, the flexible printed circuit board that connects the main circuit board and the display panel may be partially distorted. As a result, a driving circuit of the flexible printed circuit board may be damaged.

The disclosure provides a display device in which a flexible printed circuit board electrically connecting a display panel and a main circuit board is effectively prevented from being distorted.

According to an exemplary embodiment of the invention, a display device includes a display panel, a main circuit board facing a rear surface of the display panel, where the main circuit board includes a first main segment, a second main segment, and a first sub-segment disposed between the first main segment and the second main segment, and a plurality of flexible printed circuit boards which electrically connects the display panel and the main circuit board. In such an embodiment, a first cut-away portion is defined between the first main segment and the second main segment, the first main segment is bent along a first bending line defining a boundary between the first main segment and the first sub-segment, and the second main segment is bent along a second bending line defining a boundary between the second main segment and the first sub-segment.

In an embodiment, the first main segment may be inwardly bent along the first bending line to be close to the rear surface, and the second main segment may be outwardly bent along the second bending line to be away from the rear surface.

In an embodiment, the display panel may be curved along a center axis of the display panel.

In an embodiment, the flexible printed circuit boards may be disposed at one side portion of the main circuit board, and the first cut-away portion may be disposed adjacent to the one side portion and disposed between two adjacent flexible printed circuit boards among the flexible printed circuit boards.

In an embodiment, one ends of the first and second bending lines may be connected to the first cut-away portions, and the other ends of the first and second bending lines may be connected to an opposing side portion of the main circuit boards opposite to the one side portion.

In an embodiment, a distance between the first bending line and the second bending line may increase along a direction from the one side portion to the opposing side portion.

In an embodiment, a second cut-away portion may be defined between the first main segment and the first sub-segment and a third cut-away portion may be defined between the second main segment and the first sub-segment.

In an embodiment, one end and the other end of the first bending line may be respectively connected to the first cut-away portion and the second cut-away portion, and one end and the other end of the second bending line may be respectively connected to the first cut-away portion and the third cut-away portion.

In an embodiment, the first bending line and the second bending line may be left-right symmetrical with each other with respect to the first cut-away portion when viewed in a plan view.

In an embodiment, the main circuit board may include a first area overlapping the first main segment, the second main segment, and the first sub-segment, a second area, and a center area disposed between the first area and the second area, and the main circuit board may further include a third main segment, a fourth main segment, and a second sub-segment, which overlaps the second area and faces the rear surface.

In an embodiment, the first main segment may be inwardly bent along a boundary between the first main segment and the first sub-segment to be close to the rear surface in the first area, the second main segment may be outwardly bent along a boundary between the second main segment and the first sub-segment to be away from the rear surface in the first area, the third main segment is inwardly bent along a boundary between the third main segment and the second sub-segment to be close to the rear surface in the second area, the fourth main segment may be outwardly bent along a boundary between the fourth main segment and the second sub-segment to be away from the rear surface in the second area, and the first and second main segments may be left-right symmetrical with the third and fourth segments with respect to the center area.

In an embodiment, the first sub-segment may have an area substantially the same as an area of the second sub-segment when viewed in a plan view.

In an embodiment, a first angle may be defined between the first main segment and the first sub-segment due to the bending of the first main segment and the first sub-segment, a second angle may be defined between the second main segment and the first sub-segment due to the bending of the second main segment and the first sub-segment, and the first angle may be greater than the second angle.

In an embodiment, the main circuit board may have a T-like shape.

In an embodiment, the display device may further include a cover member disposed between the rear surface and the main circuit board, where the cover member includes a flat portion and a protruding portion protruded from the flat portion. In such an embodiment, the main circuit board may overlap the protruding portion.

In an embodiment, a space may be defined between the main circuit board and the rear surface, and the space may be filled with the protruding portion.

In an embodiment, the main circuit board may include a first area, a second area, and a center area defined between the first area and the second area, each of the first and second areas may include a first main segment, a second main segment, and a sub-segment, and a rear surface of a portion of the protruding portion overlapping the first area or the second area may be inclined to face the main circuit board.

In an embodiment, a slope of the rear surface of the portion of the protruding portion overlapping the first main segment may be different from a slope of the rear surface of the portion of the protruding portion overlapping the second main segment.

In an embodiment, the display device may further include an adhesive member disposed between the rear surface and the protruding portion, and the main circuit board may be attached to the protruding portion by the adhesive member.

In an embodiment, the main circuit board may include a first area and a second area, each of the first and second areas includes a first main segment, a second main segment, and a sub-segment, and an area of the sub-segment in the first area may be different from an area of the first sub-segment in the second area.

According to embodiments, the main circuit board may include a cut-away portion and a bending line. In such embodiment, the main circuit board is inwardly bent along the bending line to be close to the rear surface of the display panel or outwardly bent along the bending line to be away from the rear surface of the display panel. As a result, the tensile force or stress applied to opposite ends of the main circuit board may be reduced when the main circuit board is bent.

Accordingly, in such embodiments, the flexible printed circuit boards disposed adjacent to ends of the main circuit board may be effectively prevented from being distorted, and the circuits arranged in the flexible printed circuit boards may be effectively protected.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1A:
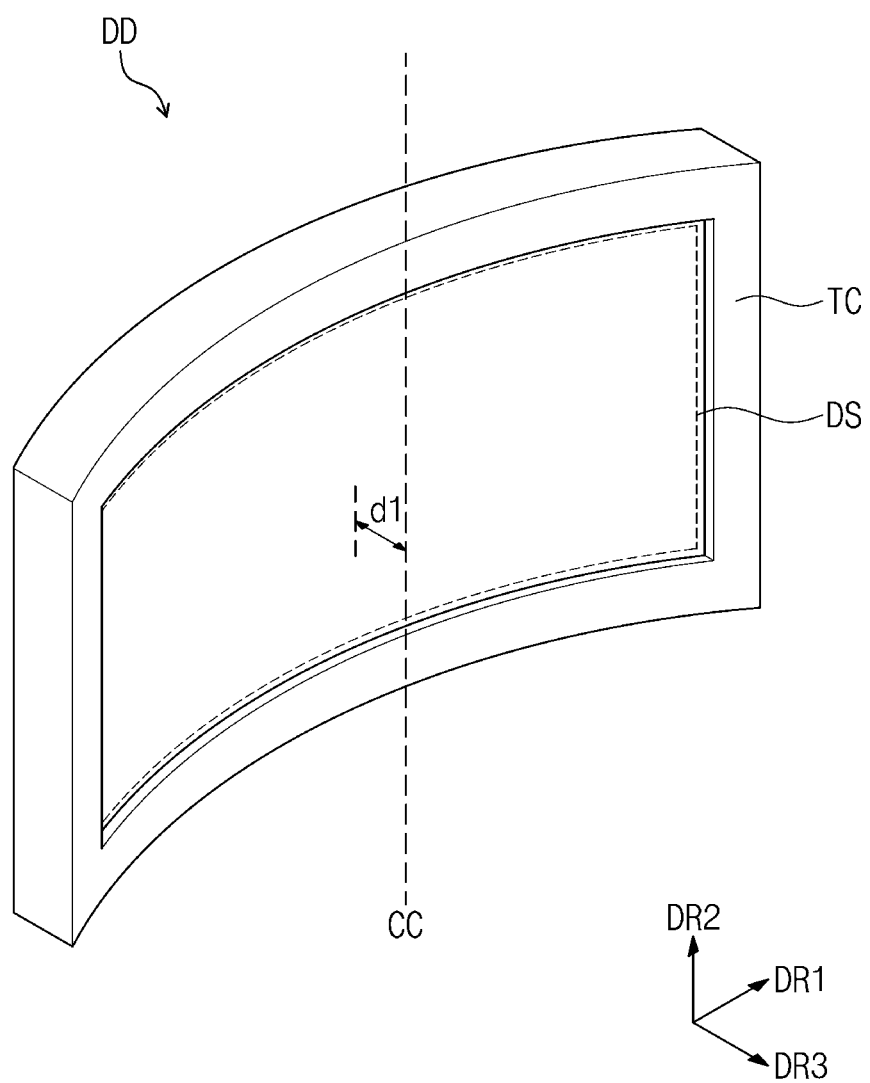
FIG. 1A is a perspective view showing a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms.

These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 1B:
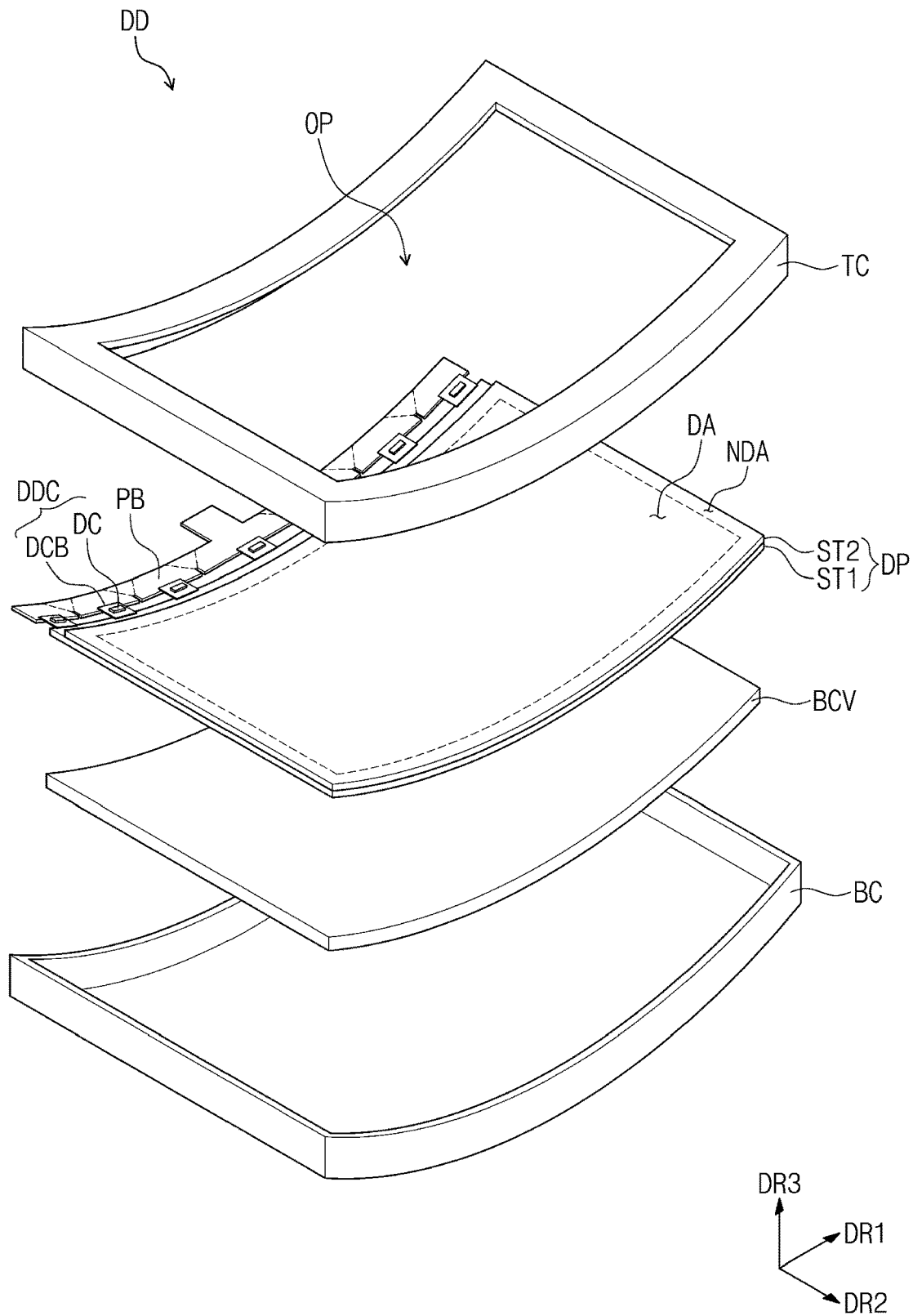
FIG. 1B is an exploded perspective view showing a display device according to an exemplary embodiment of the disclosure.

FIG. 1A is a perspective view showing a display device DD according to an exemplary embodiment of the disclosure. FIG. 1B is an exploded perspective view showing the display device DD according to an exemplary embodiment of the disclosure.

According to an exemplary embodiment, the display device DD may be included in or applied to a large-sized electronic item, such as a television set, an outdoor billboard, etc., and a small and medium-sized electronic item, such as a personal computer, a notebook computer, a car navigation unit, a camera, etc. Such an embodiment of the display device DD may be applied to a table personal computer ("PC"), a smart phone, a personal digital assistants, a portable multimedia player, a game unit, a wrist-type electronic device, etc., but not being limited thereto or thereby.

In an exemplary embodiment, the display device DD has a curved shape. In such an embodiment, where the display device DD has the curved shape, a display surface DS of the display device DD may have a curved surface shape. The display device DD displays the image having improved three-dimensional effect, sense of immersion (or immersiveness), and presence through the display surface DS having the curved surface shape.

Referring to FIG. 1A, the display device DD may be curved along or to surround a center axis CC. The center axis CC may be an imaginary line substantially parallel to a second direction DR2 and spaced apart from an upper surface of the display device DD by a predetermined distance dl. Here, the upper surface of the display device DD will be described as a display surface on which the image is displayed to be viewed by a user. Accordingly, the display surface DS of the display device DD may have a curved surface shape curved along the second direction DR2 substantially vertical to a first direction DR1.

Here, a normal line of the display panel DP indicates a third direction DR3. The third direction DR3 indicates a thickness direction of the display device DD. Front (upper) and rear (lower) surfaces of each member of the display device DD are distinct from each other in the third direction DR3. However, directions indicated by the first, second and third directions DR1, DR2 and DR3 are relative terms.

Referring to FIG. 1B, the display device DD includes a top chassis TC, the display panel DP, a cover member BCV, and a bottom chassis BC.

The top chassis TC is disposed above the display panel DP and has a frame shape defining an opening OP defined through a center portion of the top chassis TC. Alternatively, the top chassis TC may have a shape covering at least one side surface of side surfaces of the display panel DP or may be omitted. In an exemplary embodiment, the display device DD may further include a window member (not shown) through which the image is transmitted. In such an embodiment, the window member may be disposed on or in the top chassis TC.

The bottom chassis BC is disposed under the cover member BCV and accommodates the display panel DP and the cover member BCV. The bottom chassis BC may be coupled to the top chassis TC.

The display panel DP may be disposed between the top chassis TC and the cover member BCV. The display panel DP may be, but not limited to, an organic light emitting display panel, a liquid crystal display panel, a plasma display panel, an electrophoretic display panel, a microelectromechanical system display panel, or an electrowetting display panel. Hereinafter, for convenience of description, exemplary embodiments where the display panel DP is the liquid crystal display panel will be described in detail.

In such an embodiment, the display panel DP includes a first substrate ST1, a second substrate ST2, and a liquid crystal layer (not shown) interposed between the first substrate ST1 and the second substrate ST2. Although not shown in figures, the first substrate ST1 includes a plurality of pixels for displaying the image, a plurality of driving lines for driving the pixels, and a plurality of pixel electrodes. The second substrate ST2 includes a color filter and a common electrode. In an exemplary embodiment, the color filter and the common electrode are disposed on the second substrate ST2, but not being limited thereto. Alternatively, the color filter and the common electrode may be disposed on the first substrate. The liquid crystal layer may be controlled depending on a difference in voltage between the pixel electrode and the common electrode.

In an alternative exemplary embodiment, where the display panel DP is another display panel other than the liquid crystal display panel, the liquid crystal layer may be omitted, and components arranged on the first and second substrates ST1 and ST2 may be changed. In one exemplary embodiment, for example, the display panel DP may be the organic electroluminescent display panel. In such an embodiment, the liquid crystal layer is not interposed between the first substrate ST1 and the second substrate ST2, and light emitting units may be disposed on the first substrate ST1.

The display panel DP includes a display area DA and a peripheral area NDA. The display area DA is an area through which the image is displayed in the display panel DP, and the peripheral area NDA is an area in which driving circuits are disposed and through which the image is not displayed. In one exemplary embodiment, for example, the peripheral area NDA surrounds the display area DA, but not being limited thereto or thereby. Alternatively, the peripheral area NDA may be an area disposed adjacent to the display area DA.

The main circuit board PB may be connected to the first substrate ST1 through a data driving unit DDC. The main circuit board PB may be in the form of printed circuit board. The main circuit board PB generates a plurality of driving signals used to drive the display panel DP, and applies the driving signals to the first substrate ST1 through the data driving unit DDC.

In an exemplary embodiment, the main circuit board PB may be curved to correspond to the curved shape of the display panel DP. In such an embodiment, since the main circuit board PB is curved, a tensile force or stress may be applied to opposite ends of the main circuit board PB.

In such an embodiment, since a curvature of the main circuit board PB is different from a curvature of the display panel DP, a flexible printed circuit board DCB that connects the main circuit board PB and the display panel DP may be distorted.

According to an exemplary embodiment, the main circuit board PB may include a plurality of cut-away portions to reduce the tensile force or stress applied to the opposite ends of the main circuit board PB. In such an embodiment, the main circuit board PB may have a structure in which portions of the main circuit board PB are folded to prevent the data driving unit DDC disposed adjacent to opposite ends of the main circuit board PB from being distorted. Due to the folded structure of the main circuit board PB, the curvature of the main circuit board PB may be provided to correspond to the curvature of the display panel DP. Accordingly, the data driving unit DDC may be prevented from being distorted. This will be described in detail with reference to FIG. 3.

According to an exemplary embodiment, the main circuit board PB may have a T-like shape. In such an embodiment, the T-like shape may include a main portion extending in a length direction thereof, and a protruded portion extending from a center of the main portion in a width direction. The main circuit board PB may include a center area, a left area, and a right area spaced apart from the left area such that the center area is disposed between the left area and the right area. In an exemplary embodiment, the center area of the main circuit board PB has a width (or a length in the second direction DR2) longer than that of the left and right areas. As a result, the tensile force or stress may become weak in the left and right areas of the main circuit board PB, and the folded structure of the main circuit board PB may be easily implemented.

The cover member BCV faces a rear surface of the display panel DP and supports the display panel DP. In an exemplary embodiment, the cover member BCV is disposed on the rear surface of the first substrate ST1 to support the whole area of the display panel DP.

According to an exemplary embodiment, although not shown in FIG. 1B, the cover member BCV may include a flat portion and a protruding portion protruded from the flat portion. In such an embodiment, the protruding portion of the cover member BCV may be disposed between the rear surface of the display panel DP and the main circuit board PB to overlap the main circuit board PB. As described above, since the portions of the main circuit board PB may be folded, a gap may occur between the main circuit board PB and the display panel DP. The protruding portion of the cover member BCV fills the gap between the main circuit board PB and the display panel DP and fixes the display panel DP and the main circuit board PB. This will be described in detail with reference to FIG. 6.

Although not shown in figures, the display device DD may further include a backlight unit. The backlight unit generates a light and provides the light to the display panel DP.

Figure 2:
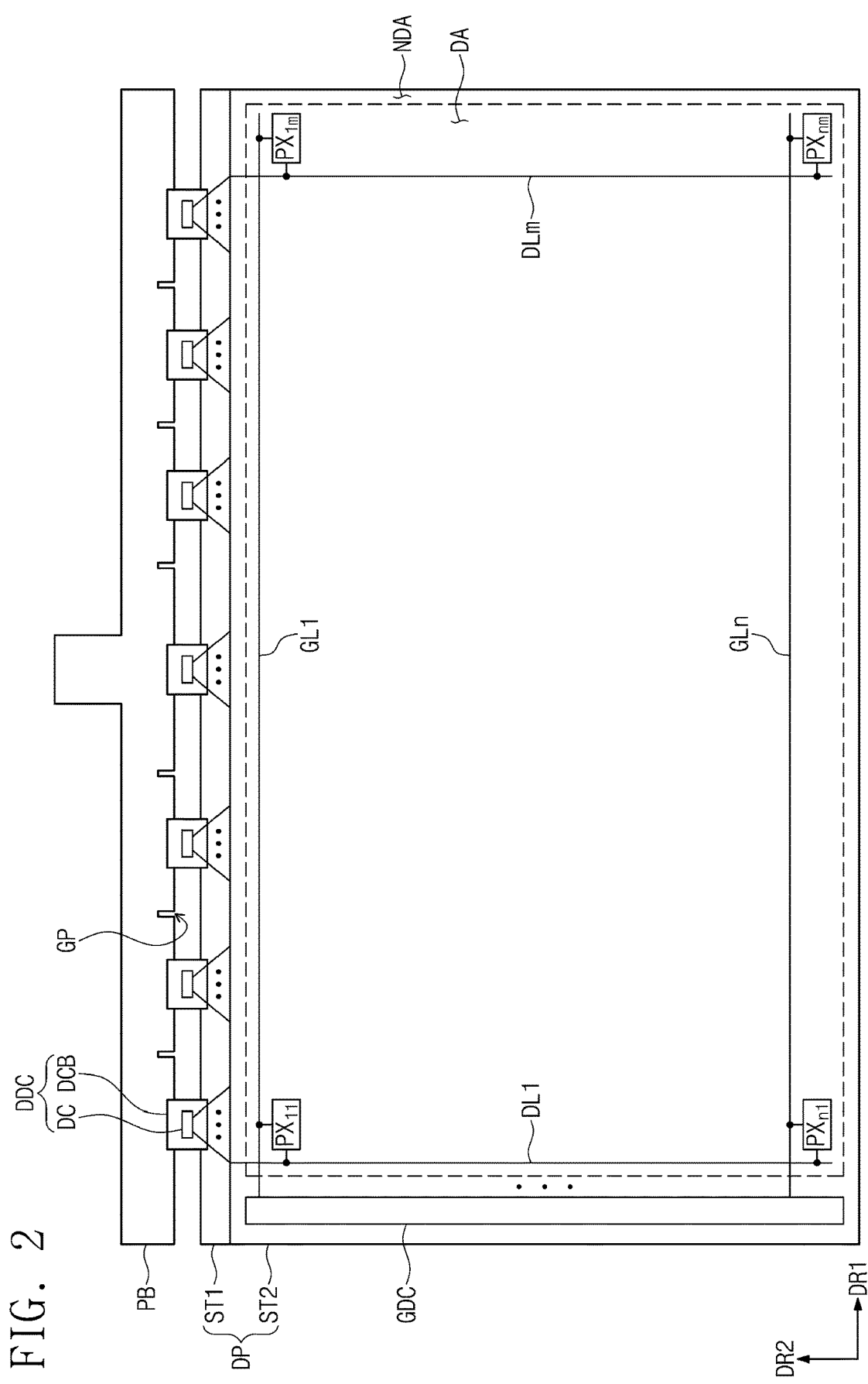
FIG. 2 is a plan view showing a display device according to an exemplary embodiment of the disclosure.
Figure 3:
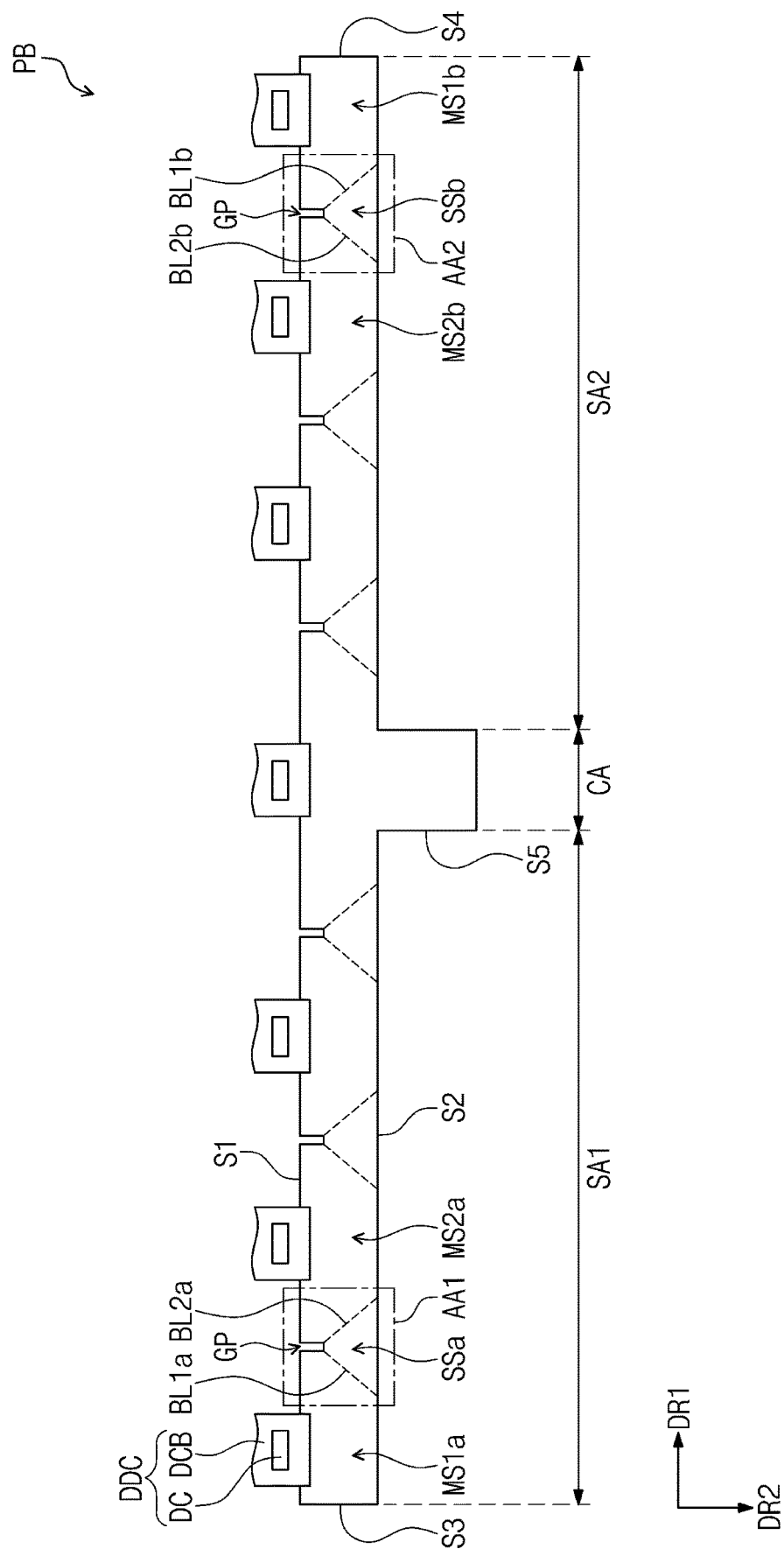
FIG. 3 is a plan view showing a main circuit board shown in FIG. 2 according to an exemplary embodiment of the disclosure.

FIG. 2 is a plan view showing a display device according to an exemplary embodiment of the disclosure. FIG. 3 is a plan view showing a main circuit board shown in FIG. 2 according to an exemplary embodiment of the disclosure.

Referring to FIGS. 2 and 3, in an exemplary embodiment of the display device, the first substrate ST1 includes a plurality of gate lines GL1 to GLn and a plurality of data lines DL1 to DLm crossing the gate lines GL1 to GLn. In such an embodiment, the first substrate ST1 includes a plurality of pixels PX11 to PXnm connected to the gate lines GL1 to GLn and the data lines DL1 to DLm. The gate lines GL1 to GLn are connected to a gate driving unit GDC. The data lines DL1 to DLm are connected to a plurality of data driving units DDC.

FIG. 2 shows only a portion of the gate lines GL1 to GLn and a portion of the data lines DL1 to DLm, and only a portion of the pixels PX11 to PXnm. Each of the pixels PX11 to PXnm is connected to a corresponding gate line of the gate lines GL1 to GLn and to a corresponding data line of the data lines DL1 to DLm.

The pixels PX11 to PXnm may be divided into a plurality of groups according to colors displayed by the pixels PX11 to PXnm. Each of the pixels PX11 to PXnm displays one of primary colors. The primary colors may include red, green, blue and white colors, for example, but not being limited thereto or thereby. The primary colors may further include various colors, such as yellow, cyan, magenta, etc.

A signal controller (not shown) may be disposed or mounted on the main circuit board PB. The signal controller receives image signals and control signals from an external graphic controller (not shown). The control signals include a vertical synchronization signal as a frame distinction signal, a horizontal synchronization signal as a row distinction signal, a data enable signal maintained at a high level during a period, in which data are output, to indicate a data input period, and clock signals. In an exemplary embodiment, the control signals may include a plurality of driving signals to drive the gate driving unit GDC and the data driving unit DDC.

The signal controller generates a gate control signal in response to the control signal and applies the gate control signal to the gate driving unit GDC to control the gate driving unit GDC. The signal controller applies a data control signal for controlling the data driving unit DDC and image data to the data driving unit DDC.

The gate driving unit GDC generates gate signals in response to the gate control signal. The gate driving unit GDC applies the gate signals to the gate lines GL1 to GLn. The gate signals may be sequentially output based on horizontal periods.

According to an exemplary embodiment, the gate driving unit GDC may be provided or formed together with the pixels PX11 to PXnm on the first substrate ST1 through a same thin film process. In one exemplary embodiment, the gate driving unit GDC may be provided or mounted in the peripheral area NDA in the form of amorphous silicon thin film transistor gate driver circuit ("ASG") or oxide semiconductor thin film transistor gate driver circuit ("OSG").

However, the gate driving unit GDC may be provided in the form of a tape carrier package ("TCP") in an alternative exemplary embodiment.

The data driving units DDC are arranged in the first direction DR1 and connected to the first substrate ST1 of the display panel DP. The data driving units DDC generate grayscale voltages corresponding to image data provided from the signal controller based on the data control signal provided from the signal controller. The data driving units DDC apply the grayscale voltages to the data lines DL1 to DLm as data signals.

In an exemplary embodiment, the data driving unit DDC is provided in plural number, but not being limited thereto. Alternatively, the data driving unit DDC may be provided as a single data driving unit. Hereinafter, for the convenience of description, one data driving unit DDC will be described in detail, but the number of the data driving unit DDC are not limited to one.

The data driving unit DDC may include a data driving chip DC and a flexible printed circuit board DCB, on which the data driving chip DC is disposed or mounted. The flexible printed circuit board PCB electrically connects the main circuit board PB and the first substrate ST1. The data driving chip DC applies the data signals to corresponding data lines among the data lines DL1 to DLm.

According to an exemplary embodiment, the gate control signal output from the signal controller may be applied to the gate driving unit GDC through the flexible printed circuit board DCB. In such an embodiment, a dummy line may be disposed on the flexible printed circuit board DCB to transmit the gate signals output from the signal controller to the gate driving unit GDC. In such an embodiment, the flexible printed circuit board, on which the dummy line is disposed, may be the closest one to the gate driving unit among flexible printed circuit boards.

The main circuit board PB is connected to one end of the flexible printed circuit board PB and disposed on the rear surface of the display panel DP such that the cover member BCV is disposed between the rear surface of the display panel DP and the main circuit board PB. The rear surface of the display panel DP may be a surface facing the upper surface of the display panel DP, on which the image is displayed to the user. In such an embodiment, the main circuit board PB may be provided as the printed circuit board and have flexibility property.

In an exemplary embodiment, as described above, the main circuit board PB may include the cut-away portions GP. Each cut-away portion may be a first cut-away portion defined at one side portion S1 of the main circuit board PB connected to the flexible printed circuit board DCB. Due to the cut-away portions GP, the tensile force or stress applied to the opposite ends of the main circuit board PB in the first direction DR1 may be reduced when the main circuit board PB is curved. According to an exemplary embodiment, the cut-away portion GP may have a linear shape. In such an embodiment, the cut-away portion GP is described as a "line" shape with reference to FIG. 3, but the shape of the cut-away portion GP is not limited thereto or thereby. In alternative exemplary embodiments, the cut-away portion GP may have a variety of shapes, e.g., a circular shape, a quadrangular shape, a triangular shape, etc., to reduce the tensile force or stress applied to the main circuit board PB.

In an exemplary embodiment, the main circuit board PB includes the one side portion S1, an opposing side portion S2, and first and second connecting side portions S3 and S4 connecting the one side portion S1 and the opposing side portion S2. In such an embodiment, the main circuit board PB may include an extension side portion S5 extending from the opposing side portion S2.

According to an exemplary embodiment, the main circuit board PB may include a first main segment, a second main segment, and a sub-segment in each of first and second areas SA1 and SA2. In an exemplary embodiment, the main circuit board PB may be folded along a boundary between the first main segment and the sub-segment and a boundary between the second main segment and the sub-segment.

In an exemplary embodiment, as shown in FIG. 3, the main circuit board PB includes the first main segment MS1a, the second main segment MS2a, and a first sub-segment SSa disposed between the first and second main segments MS1a and MS2a in the first area SA1. The first main segment MS1a, the second main segment MS2a, and the first sub-segment SSa may be arranged in the first direction DR1.

In such an embodiment, the first main segment MS1a may have a shape same as or different from the shape of the second main segment MS2a. In an exemplary embodiment, where the first main segment MS1a and the second main segment MS2a are provided in plural, the first main segments may have the same shape as or different shape from each other, and the second main segments may have the same shape as or different shape from each other.

The cut-away portion GP may be defined between the first main segment MS1a and the second main segment MSQ2a to be adjacent to the one side portion S1. In one exemplary embodiment, for example, the cut-away portion GP may be placed between two adjacent flexible printed circuit boards among the flexible printed circuit boards. In such an embodiment, the two adjacent flexible printed circuit boards adjacent to each other may be spaced apart from the cut-away portion GP with a same distance in the first direction DR1.

The flexible printed circuit board DCB may be disposed at the one side portion S1 of each of the first and second main segments MS1a and MS2a. In an exemplary embodiment, one flexible printed circuit board DCB is disposed at the one side portion S1 of each of the first and second main segments MS1a and MS2a, but the number of the flexible printed circuit board DCB disposed at the one side portion S1 of each of the first and second main segments MS1a and MS2a may not be limited to one. Alternatively, two or more flexible printed circuit boards DCB may be disposed at the one side portion S1 of each of the first and second main segments MS1a and MS2a.

According to an exemplary embodiment, the main circuit board PB may include a first bending line BL1a and a second bending line BL2a. The first bending line BL1a may be an imaginary folding line defining the boundary between the first main segment MS1a and the first sub-segment SSa. The second bending line BL2a may be an imaginary folding line defining the boundary between the second main segment MS2a and the first sub-segment SSa. In one exemplary embodiment, for example, the first bending line BL1a and the second bending line BL2a may include a predetermined recess, but not being limited thereto or thereby.

According to an exemplary embodiment, the first main segment MS1a and the first sub-segment SSa may be inwardly bent along the first bending line BL1a to be close to the rear surface of the display panel DP. In such an embodiment, the second main segment MS2a and the first sub-segment SSa may be outwardly bent along the second bending line BL2a to be away from the rear surface of the display panel DP.

Hereinafter, a state in which the main circuit board PB is bent in a direction toward the rear surface of the display panel DP is referred to as an "inner-bending". On the contrary, a state in which the main circuit board PB is bent in a direction opposite to the direction toward the rear surface of the display panel DP is referred to as an "outer-bending".

In an exemplary embodiment, one end of the first bending line BL1a is disposed adjacent to the cut-away portion GP, and the other end of the first bending line BL1a is disposed adjacent to the opposing side portion S2 of the main circuit board PB. In one exemplary embodiment, for example, the one end of the first bending line BL1a is connected to an end of the cut-away portion GP, and the other end of the first bending line BL1a is connected to the opposing side portion S2 of the main circuit board PB, as shown in FIG. 3.

In an exemplary embodiment, one end of the second bending line BL2a is disposed adjacent to the cut-away portion GP, and the other end of the second bending line BL2a is disposed adjacent to the opposing side portion S2 of the main circuit board PB. In one exemplary embodiment, for example, the one end of the second bending line BL2a is connected to an end of the cut-away portion GP, and the other end of the second bending line BL2a is connected to the opposing side portion S2 of the main circuit board PB, as shown in FIG. 3.

According to exemplary embodiments, the cut-away portion GP is defined in the main circuit board PB in a way such that the cut-away portion GP extends from the one side portion S1 of the main circuit board PB to the one end of each of the first and second bending lines BL1a and BL2a.

In an exemplary embodiment, the one end of each of the first and second bending lines BL1a and BL2a is connected to the end of the cut-away portion GP, but not being limited thereto or thereby. Alternatively, the one end of each of the first and second bending lines BL1a and BL2a may be connected to the cut-away portion GP in addition to the end of the cut-away portion GP such that the one end of the first bending line BL1a is spaced apart from the one end of the second bending line BL2a in the second direction DR2.

According to an exemplary embodiment, the first bending line BL1a and the second bending line BL2a are left-right symmetrical (or reflection symmetric) with respect to the cut-away portion GP on a plane surface defined by the first and second directions DR1 and DR2. In such an embodiment, a distance between the first and second bending lines BL1a and BL2a becomes larger as a distance from the one side portion S1 increases and a distance from the opposing side portion S2 decreases. Here, the distance between the first and second bending lines BL1a and BL2a may be a distance in the first direction DR1.

In the second area SA2, the main circuit board PB includes a third main segment MS1b, a fourth main segment MS2b, and a second sub-segment SSb disposed between the third main segment MS1b and the fourth main segment MS2b. The third main segment MS1b, the fourth main segment MS2b, and the second sub-segment SSb may be arranged in the first direction DR1. The third main segment MS1b may have a shape corresponding to that of the first main segment MS1a. The fourth main segment MS2b may have a shape corresponding to that of the second main segment MS2a. The second sub-segment SSb may have a shape corresponding to that of the first sub-segment SSa.

In an exemplary embodiment, as shown in FIG. 3, the third main segment MS1b, the fourth main segment MS2b, and the second sub-segment SSb are left-right symmetrical with the first main segment MS1a, the second main segment MS2a, and the first sub-segment SSa with respect to the second direction DR2.

According to an exemplary embodiment, the main circuit board PB may include may include a third bending line BL1b and a fourth bending line BL2b. The third bending line BL1b may be an imaginary folding line defining the boundary between the third main segment MS1b and the second sub-segment SSb. The fourth bending line BL2b may be an imaginary folding line defining the boundary between the fourth main segment MS2b and the second sub-segment SSb. In one exemplary embodiment, for example, the third bending line BL1b and the fourth bending line BL2b may include a predetermined recess, but not being limited thereto or thereby.

According to an exemplary embodiment, the third main segment MS1b and the second sub-segment SSb may be inwardly bent along the third bending line BL1b to be close to the rear surface of the display panel DP. The fourth main segment MS2b and the second sub-segment SSb may be outwardly bent along the fourth bending line BL2b to be away from the rear surface of the display panel DP.

Figure 4A:
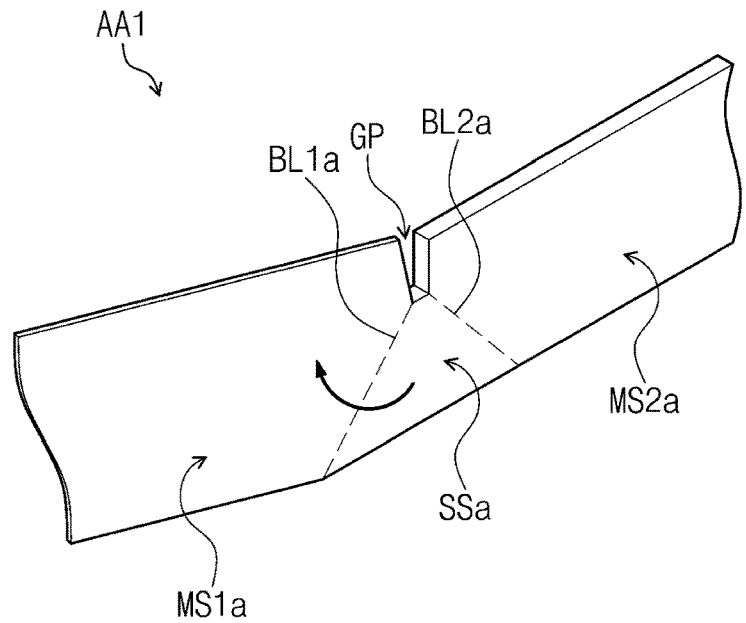
FIGS. 4A to 4C are enlarged perspective views showing an area "AA1" shown in FIG. 3 according to an exemplary embodiment of the disclosure.
Figure 4B:
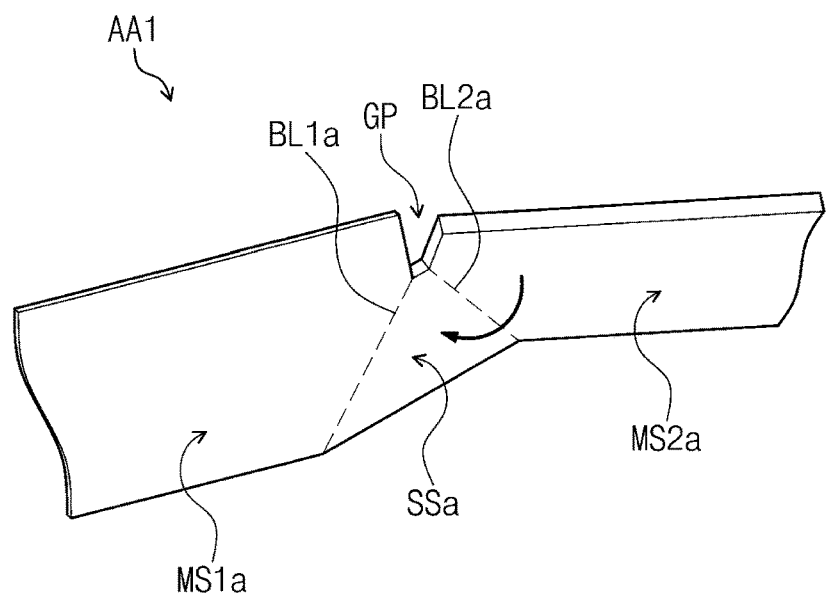
Figure 4C:
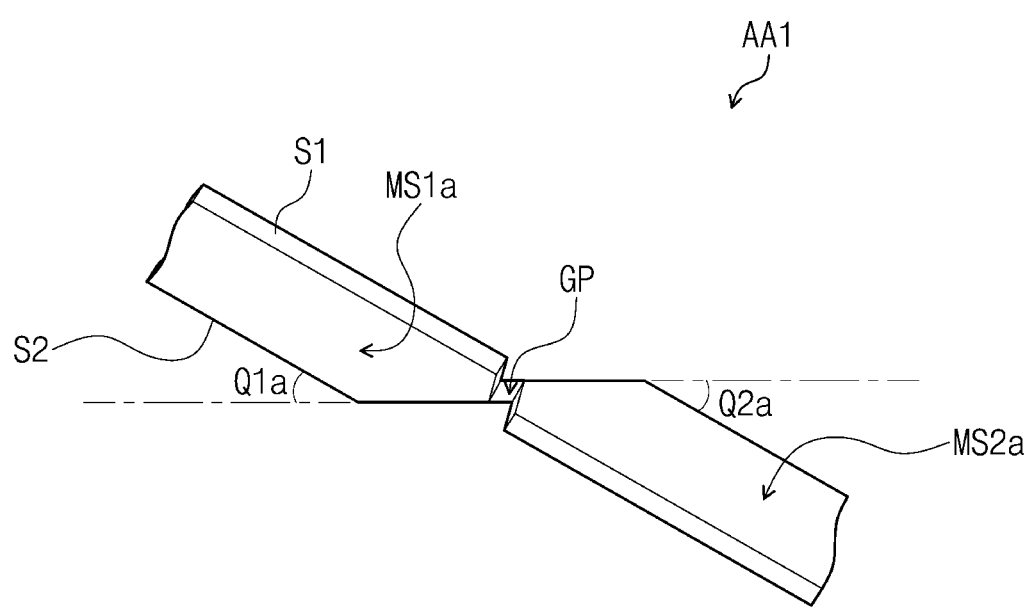

FIGS. 4A to 4C are enlarged perspective views showing an area "AA1" shown in FIG. 3. FIG. 4A shows a folding state of the first main segment MS1a, FIG. 4B shows a folding state of the second main segment MS2a, and FIG. 4C shows an inclined angle between the first main segment MS1a and the second main segment MS2a with respect to the first sub-segment SSa.

Referring to FIGS. 4A to 4C, in an exemplary embodiment, the first main segment MS1a may be inwardly bent along the first bending line BL1a to be close to the rear surface of the display panel DP. The second main segment MS2a may be outwardly bent along the second bending line BL2a to be away from the rear surface of the display panel DP.

In such an embodiment, the first main segment MS1a may be inwardly bent to form a predetermined angle with the first sub-segment SSa. The angle between the first main segment MS1a and the first sub-segment SSa is referred to as a "first angle Q1a". In such an embodiment, the first main segment MS1a may be inwardly bent along a clockwise direction based on the first bending line BL1a.

The second main segment MS2a may be outwardly bent to form a predetermined angle with the first sub-segment SSa. The angle between the second main segment MS2a and the first sub-segment SSa is referred to as a "second angle Q2a". In such an embodiment, the second main segment MS2a may be outwardly bent along a clockwise direction based on the second bending line BL2a.

According to an exemplary embodiment, the first angle Q1a may be different from the second angle Q2a. In one exemplary embodiment, for example, the first angle Q1a may be greater than the second angle Q2a. The degree of the bending of the main circuit board PB may be increased as a distance from the center area CA of the main circuit board PB increases in the first direction DR1. Accordingly, the first angle Q1a is greater than the second angle Q2a, and thus the main circuit board PB may be disposed more adjacent to the rear surface of the display panel DP.

In alternative exemplary embodiments, the first angle Q1a may be equal to the second angle Q2a, or the second angle Q2a may be greater than the first angle Q1a.

In exemplary embodiments, as described above, the flexible printed circuit board DCB which connects the main circuit board PB and the display panel DP may be effectively prevented from being distorted. In such an embodiment, the curvature of the curved display panel DP becomes similar to the curvature of the main circuit board PB when the first and second main segments MS1*a* and MSQ2*a* are independently bent.

Figure 5A:
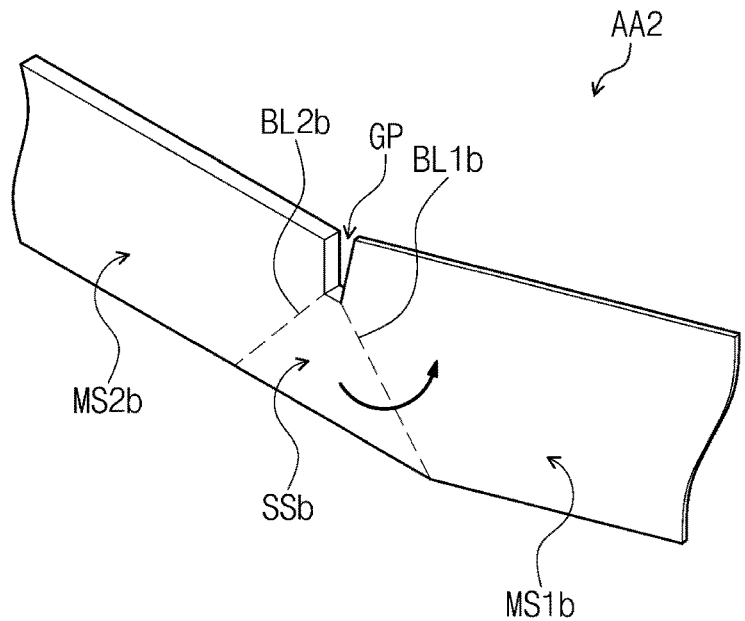
FIGS. 5A to 5C are enlarged perspective views showing an area "AA2" shown in FIG. 3 according to an exemplary embodiment of the disclosure.
Figure 5B:
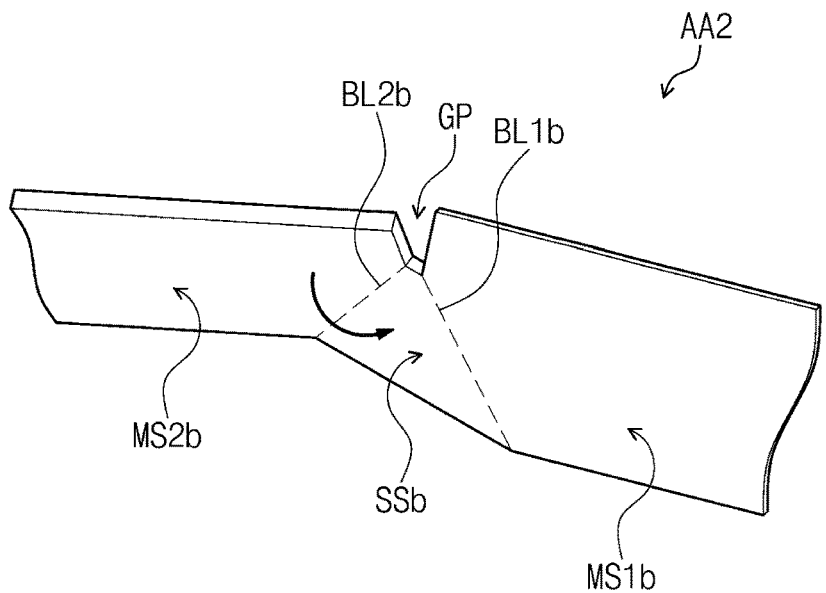
Figure 5C:
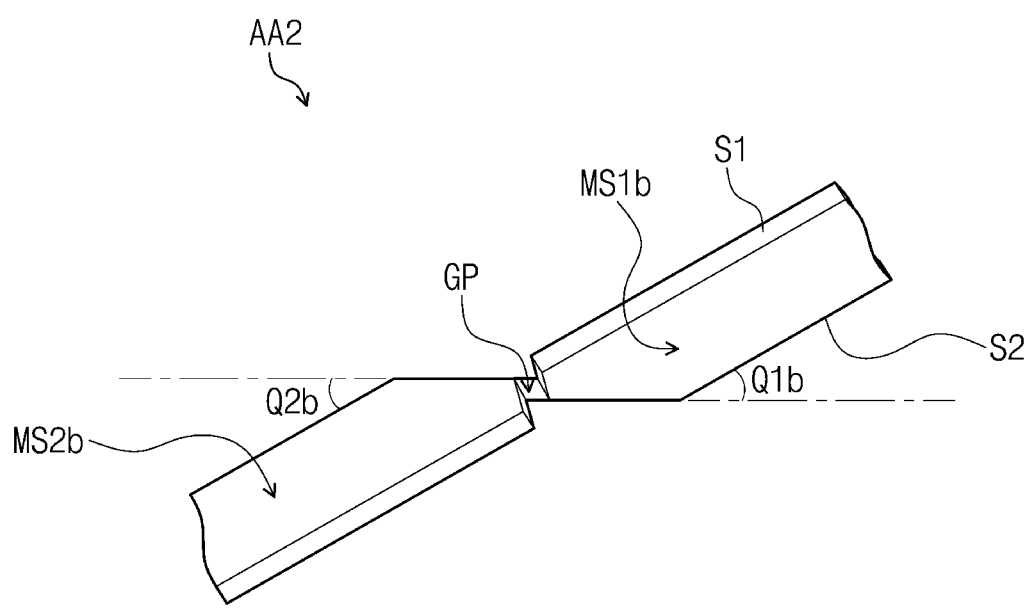

FIGS. 5A to 5C are enlarged perspective views showing an area "AA2" shown in FIG. 3. FIG. 5A shows a folding state of the third main segment MS1*b*, FIG. 5B shows a folding state of the fourth main segment MS2*b*, and FIG. 5C shows an inclined angle between the third main segment MS1*b* and the fourth main segment MS2*b* with respect to the second sub-segment SSb.

Referring to FIGS. 5A to 5C, the third main segment MS1*b* may be outwardly bent along the third bending line BL1*b* to be away from the rear surface of the display panel DP. The fourth main segment MS2*b* may be inwardly bent along the fourth bending line BL2*b* to be close to the rear surface of the display panel DP.

In an exemplary embodiment, the third main segment MS1*b* may be outwardly bent to form a predetermined angle with the second sub-segment SSb. The angle between the third main segment MS1*b* and the second sub-segment SSb, when viewed from a plan view in the width direction of the second sub-segment SSb, is referred to as a "third angle Q1*b*". In such an embodiment, the third main segment MS1*b* may be outwardly bent along a clockwise direction based on the third bending line BL1*b*.

The fourth main segment MS2*b* may be inwardly bent to form a predetermined angle with the second sub-segment SSb. The angle between the fourth main segment MS2*b* and the second sub-segment SSb, when viewed from the plan view in the width direction of the second sub-segment SSb, is referred to as a "fourth angle Q2*b*". In an exemplary embodiment, the fourth main segment MS2*b* may be inwardly bent along a clockwise direction based on the fourth bending line BL2*b*.

According to an exemplary embodiment, the third angle Q1*b* may be different from the fourth angle Q2*b*. In one exemplary embodiment, for example, the third angle Q1*b* may be greater than the fourth angle Q2*b*. The degree of the bending of the main circuit board PB may be increased as a distance from the center area CA of the main circuit board PB increases in the first direction DR1. Accordingly, the third angle Q1*b* is greater than the fourth angle Q2*b*, and thus the main circuit board PB may be disposed more adjacent to the rear surface of the display panel DP. In an alternative exemplary embodiment, the third angle Q1*b* may be equal to the fourth angle Q2*b*, or the fourth angle Q2*b* may be greater than the third angle Q1*b*.

In an exemplary embodiment, as described above, the flexible printed circuit board DCB that connects the main circuit board PB and the display panel DP may be effectively prevented from being distorted. In such an embodiment, the curvature of the curved display panel DP becomes similar to the curvature of the main circuit board PB after the third and fourth main segments MS1*b* and MS2*b* are independently bent.

Figure 6:
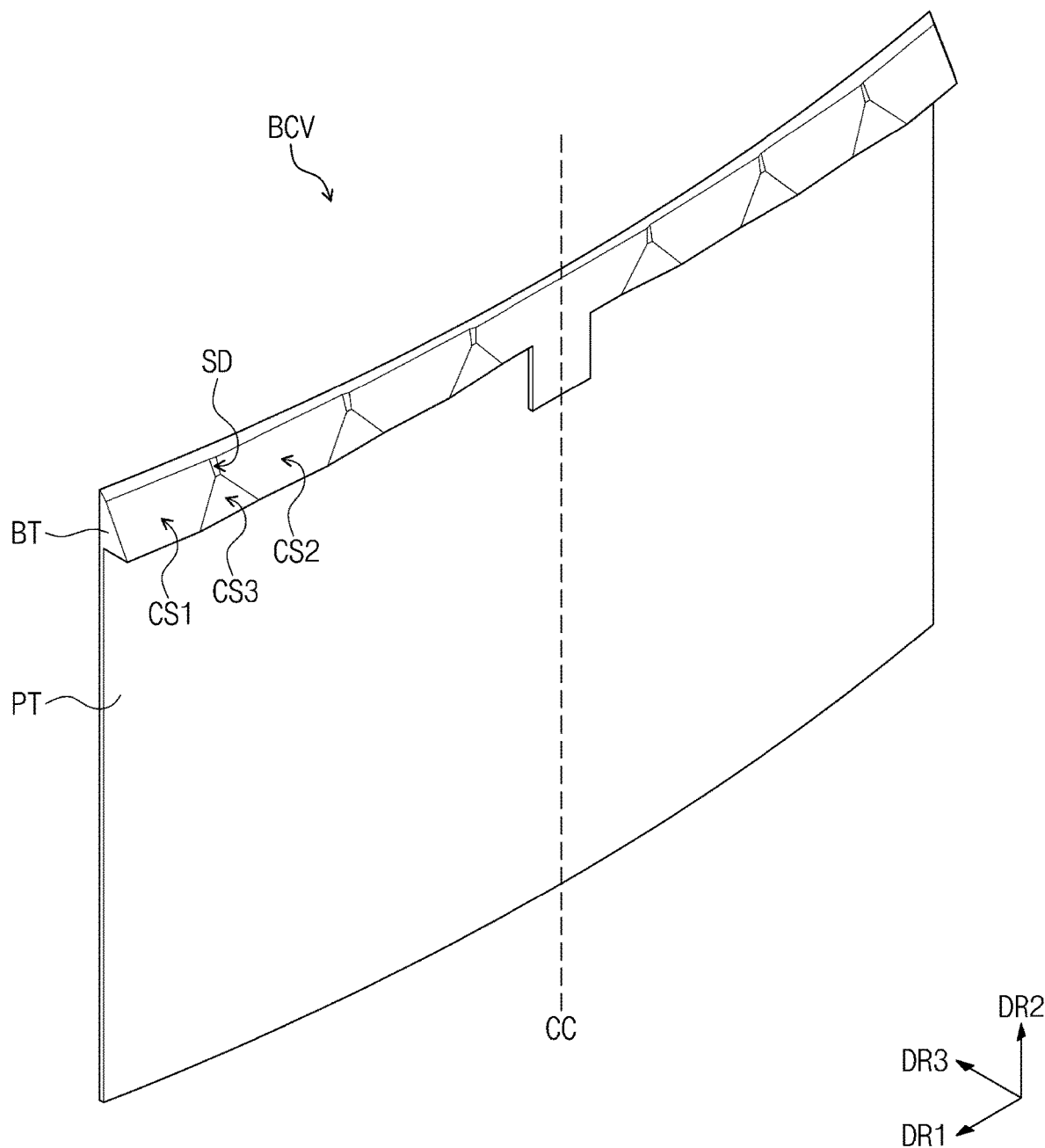
FIG. 6 is a perspective view showing a cover member according to an exemplary embodiment of the disclosure.
Figure 7:
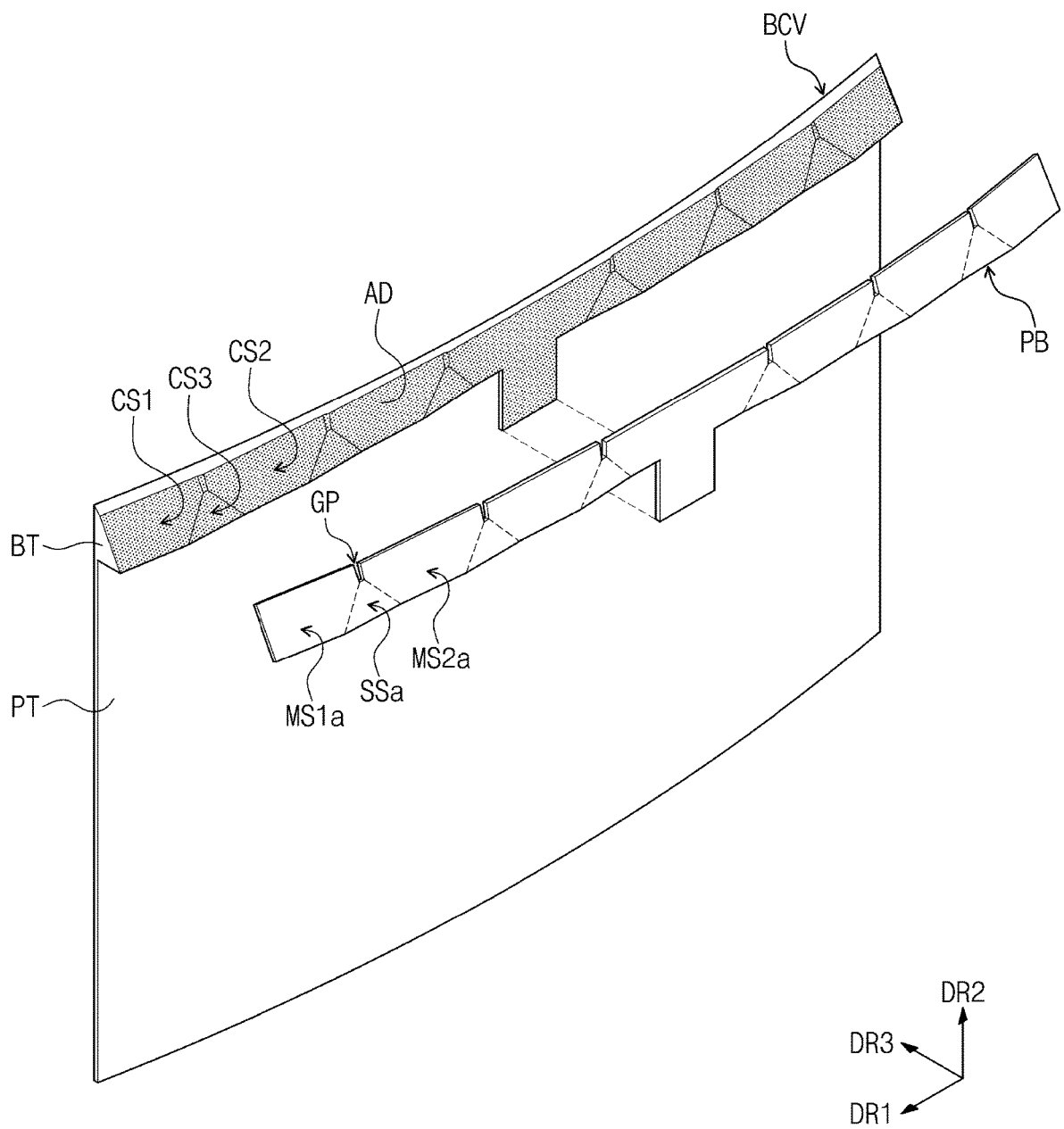
FIG. 7 is an exploded perspective view showing a rear surface of a display panel and a cover member according to an exemplary embodiment of the disclosure.
Figure 8:
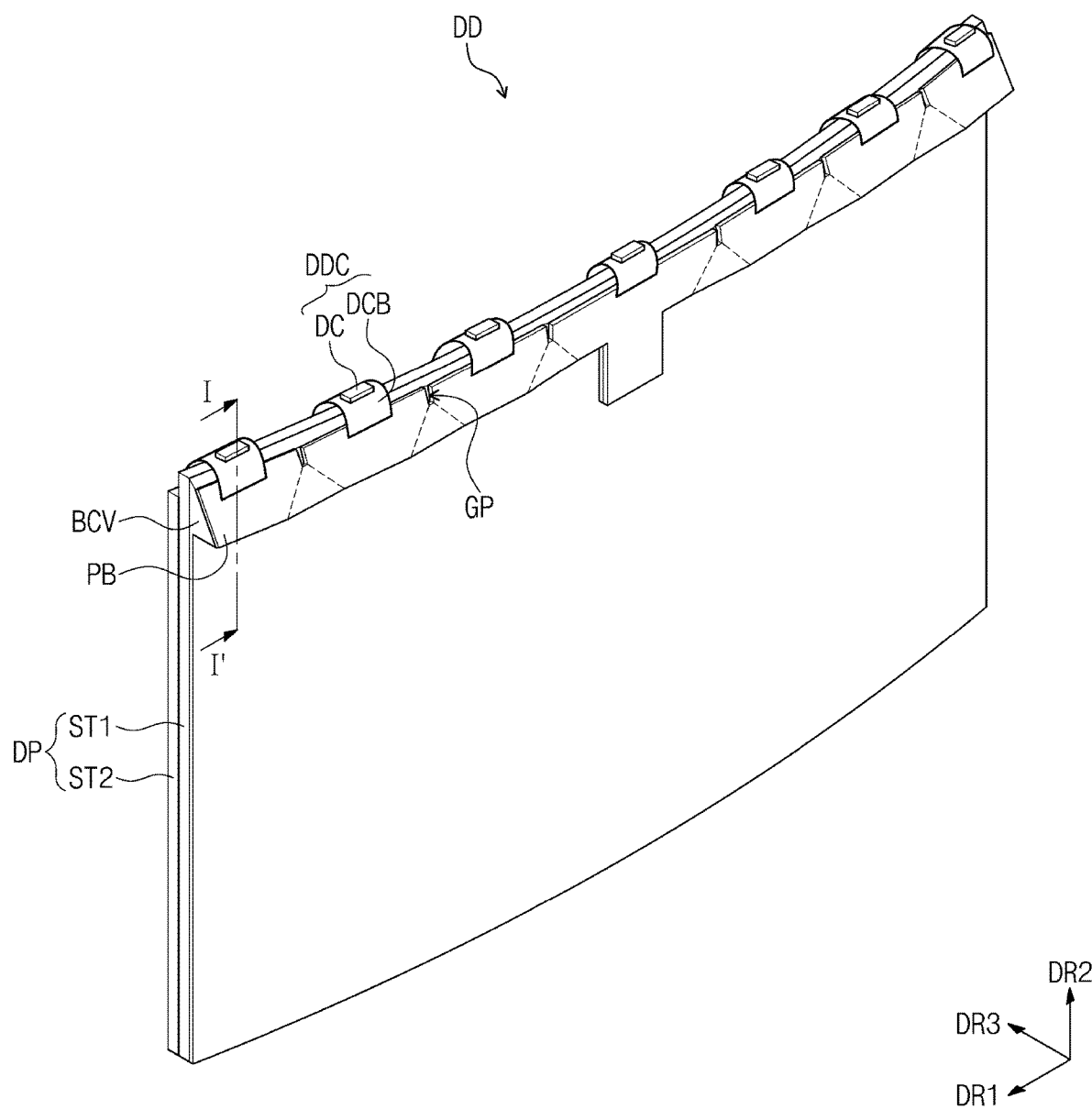
FIG. 8 is a perspective view showing an assembled structure of a display panel and a main circuit board according to an exemplary embodiment of the disclosure.
Figure 9:
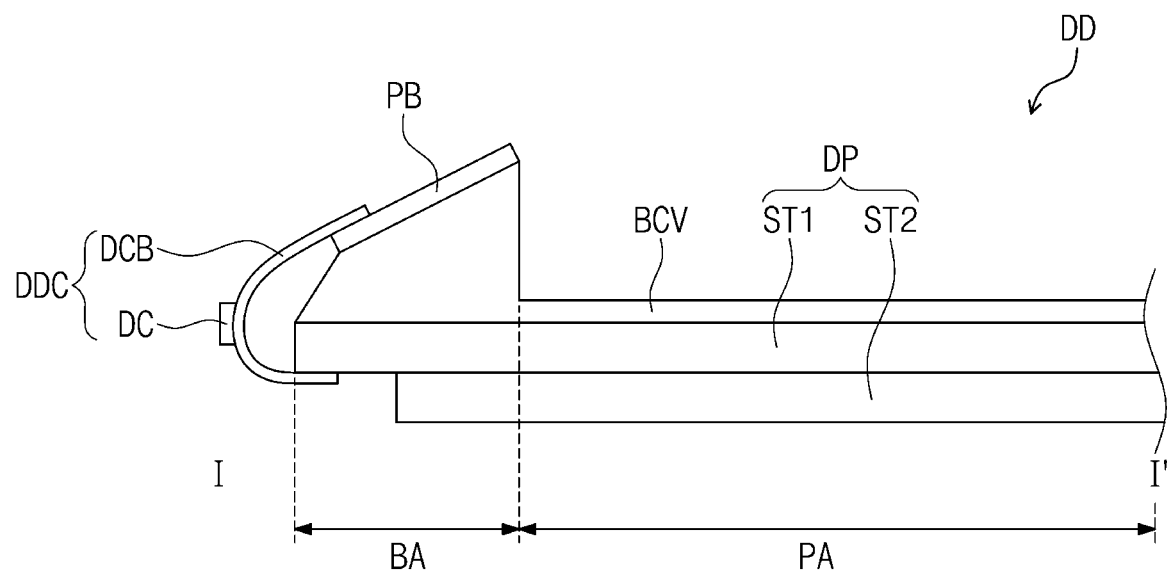
FIG. 9 is a cross-sectional view taken along line I-I' shown in FIG. 8.

FIG. 6 is a perspective view showing a cover member according to an exemplary embodiment of the disclosure. FIG. 7 is an exploded perspective view showing a rear surface of a display panel and a cover member according to an exemplary embodiment of the disclosure. FIG. 8 is a perspective view showing an assembled structure of a display panel and a main circuit board according to an exemplary embodiment of the disclosure. FIG. 9 is a cross-sectional view taken along line I-I' shown in FIG. 8.

Referring to FIGS. 6 and 7, the cover member BCV is disposed on the rear surface of the display panel DP to support the display panel DP. The cover member BCV may include the flat portion PT and the protruding portion BT protruded from the flat portion PT. The cover member BCV may be curved along or to surround the center axis CC as similar to the display panel DP shown in FIG. 1A.

According to an exemplary embodiment, the protruding portion BT has a shape protruded to the third direction DR3 and overlaps the main circuit board PB (refer to FIG. 3). The main circuit board PB may be disposed at the protruding portion BT. The flat portion PT may be a curved plan surface defined in the first and second directions DR1 and DR2 and not overlap the main circuit board PB.

According to an exemplary embodiment, the cover member BCV may be provided by an injection molding process. In such an embodiment, the protruding portion BT and the flat portion PT of the cover member BCV may be provided by the injection molding process to correspond to the gap between the main circuit board PB and the display panel DP. In an exemplary embodiment, the cover member BCV is provided by the injection molding process, but not being limited thereto. Alternatively, the cover member BCV may be provided in various ways.

In an exemplary embodiment, as described above, the main circuit board PB may be bent by the main segments and the sub-segments. As a result, when the main circuit board PB is provided on or attached to the rear surface of the display panel DP, the gap may occur between the rear surface of the display panel DP and the main circuit board PB. Here, the third direction DR3 indicates the thickness direction of the display panel DP.

The protruding portion BT may fill the gap between the main circuit board PB and the rear surface of the display panel DP. In such an embodiment, the protruding portion BT is disposed between the main circuit board PB and the display panel DP to fix the main circuit board PB to the display panel DP.

In an exemplary embodiment, as shown in FIG. 7, an adhesive member AD may be disposed on an upper surface of the protruding portion BT. In such an embodiment, where the main circuit board PB is disposed on the protruding portion BT, the main circuit board PB and the protruding portion BT may be attached to each other by the adhesive member AD. In an exemplary embodiment, the adhesive member AD is disposed on the upper surface of the protruding portion BT, but not being limited thereto. Alternatively, the adhesive member AD may be disposed on the main circuit board PB.

In an exemplary embodiment, a surface of the protruding portion BT facing the main circuit board PB in the third direction DR3 may have a shape corresponding to the shape of the main circuit board PB. In an exemplary embodiment, a front surface of the protruding portion BT may face the display panel DP in the third direction DR3, and a rear surface of the protruding portion BT may face the main circuit board PB in the third direction DR3. Hereinafter, the rear surface of the protruding portion BT facing the main circuit board PB in the third direction DR3 may be referred to as a protruding surface.

The protruding surface may include a first protruding surface CS1 corresponding to the shape of the first main segment MS1*a* of the main circuit board PB. The protruding surface may include a second protruding surface CS2 corresponding to the shape of the second main segment MSQ2*a* of the main circuit board PB. The protruding surface may include a third protruding surface CS3 corresponding to the shape of the first sub-segment SSa of the main circuit board PB. The third protruding surface CS3 may be disposed between the first protruding surface CS1 and the second protruding surface CS2.

In such an embodiment, a cut-away portion SD may be defined in the protruding portion BT to be disposed between the first protruding surface CS1 and the second protruding surface CS2. The cut-away portion SD may correspond to the cut-away portion GP of the main circuit board PB. Alternatively, the cut-away portion SD defined in the protruding portion BT may be omitted.

According to an exemplary embodiment, the first protruding surface CS1 may have a shape inclined in the third direction DR3 with respect to the second direction DR2 corresponding to the inwardly-bent shape of the first main segment MS1a. The second protruding surface CS2 may have a shape inclined in the third direction DR3 with respect to the second direction DR2 corresponding to the outwardly-bent shape of the second main segment MS2a. In such an embodiment, a slope of the first protruding surface CS1 and a slope of the second protruding surface CS2 may be different from each other.

In an exemplary embodiment, as described above, the protruding surface of the protruding portion BT may be provided to correspond to the shape of the main circuit board PB, and thus the protruding surface of the protruding portion BT may be effectively attached to the main circuit board PB.

Referring to FIGS. 8 and 9, the cover member BCV is disposed on the rear surface of the display panel DP, and main circuit board PB is disposed on the protruding portion BT (refer to FIG. 7) of the cover member BCV. In such an embodiment, the cover member BCV is disposed between the rear surface of the display panel DP and the main circuit board PB, such that an empty space may not be defined between the main circuit board PB and the rear surface of the display panel DP. As a result, the main circuit board PB may be effectively prevented from moving.

In an exemplary embodiment, as shown in FIG. 9, the cover member BCV may include a protruding area BA corresponding to the protruding portion BT and a flat area PA corresponding to the flat portion PT. In such an embodiment, a center portion of the cover member BCV disposed at the center area CA of the main circuit board PB is described as being excluded from the protruding area BA.

In the protruding area BA, the cover member BCV may have a shape protruded along the third direction DR3 and inclined in the third direction DR3 with respect to the second direction DR2. In the protruding area BA, the main circuit board PB may be disposed on the upper surface of the cover member BCV. The cover member BCV is disposed on the rear surface of the rear surface of the display panel DP to support the entire portion of the display panel DP.

Figure 10:
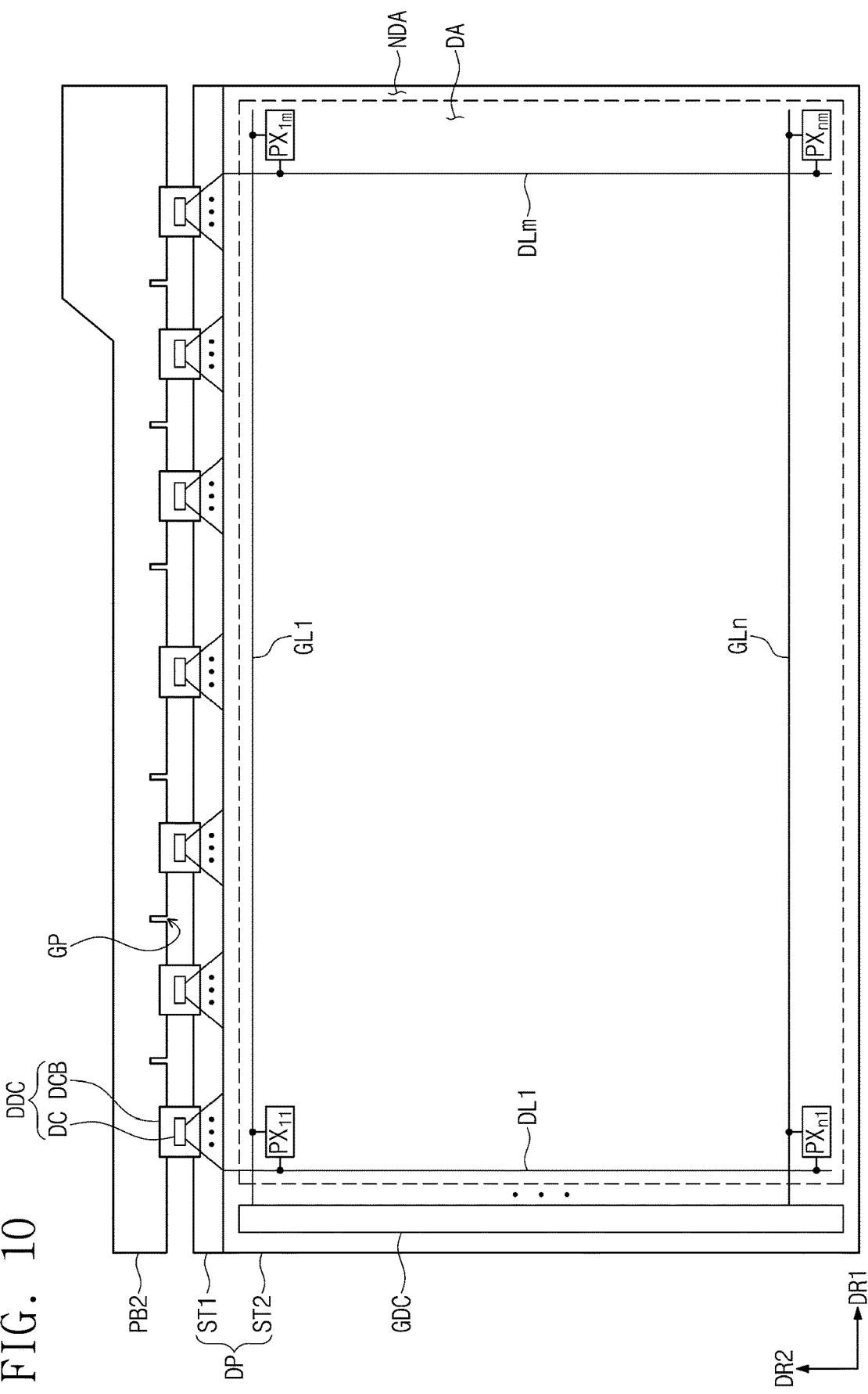
FIG. 10 is a block diagram showing a display device according to an alternative exemplary embodiment of the disclosure.
Figure 11:
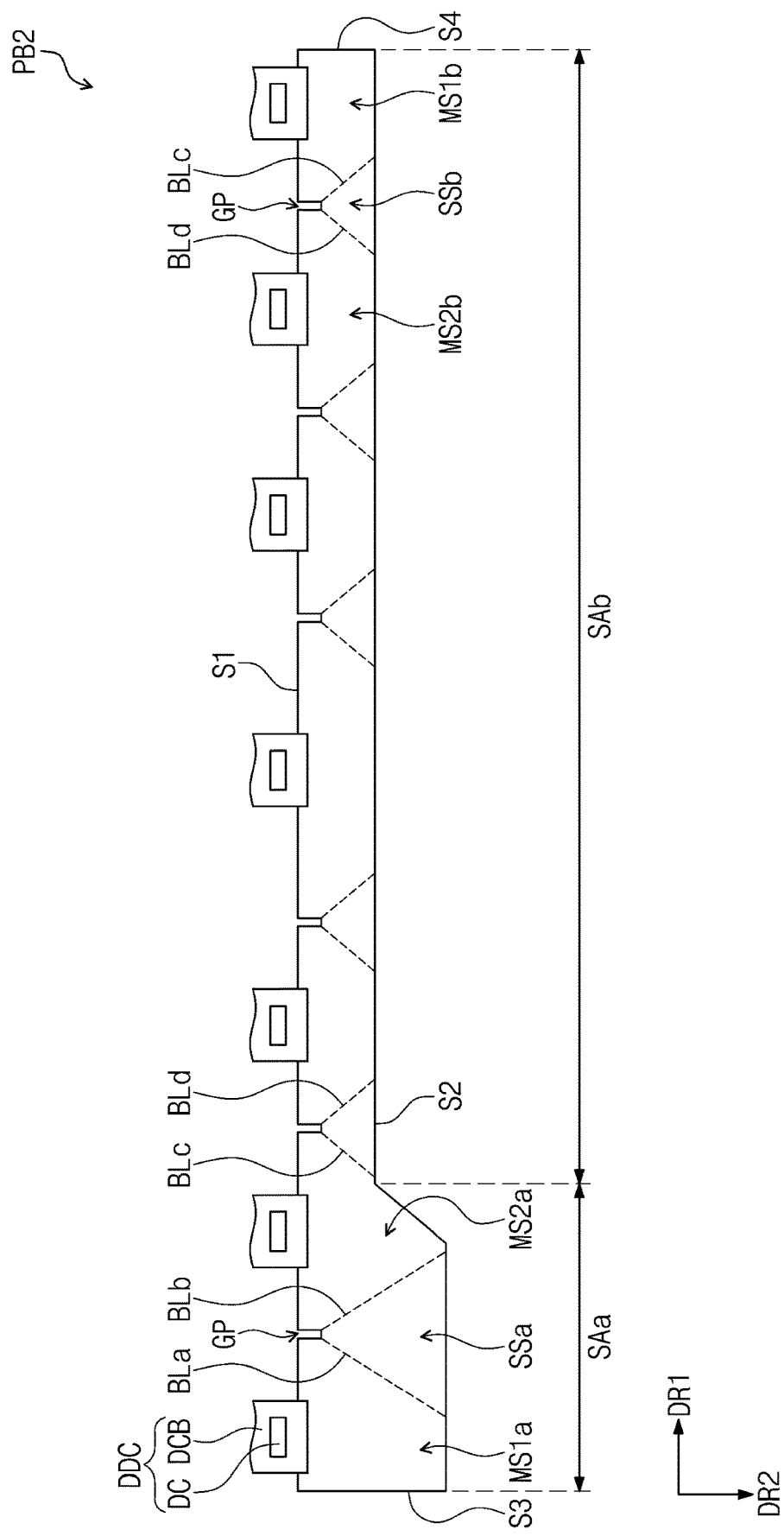
FIG. 11 is a plan view showing a main circuit board shown in FIG. 10.
Figure 12:
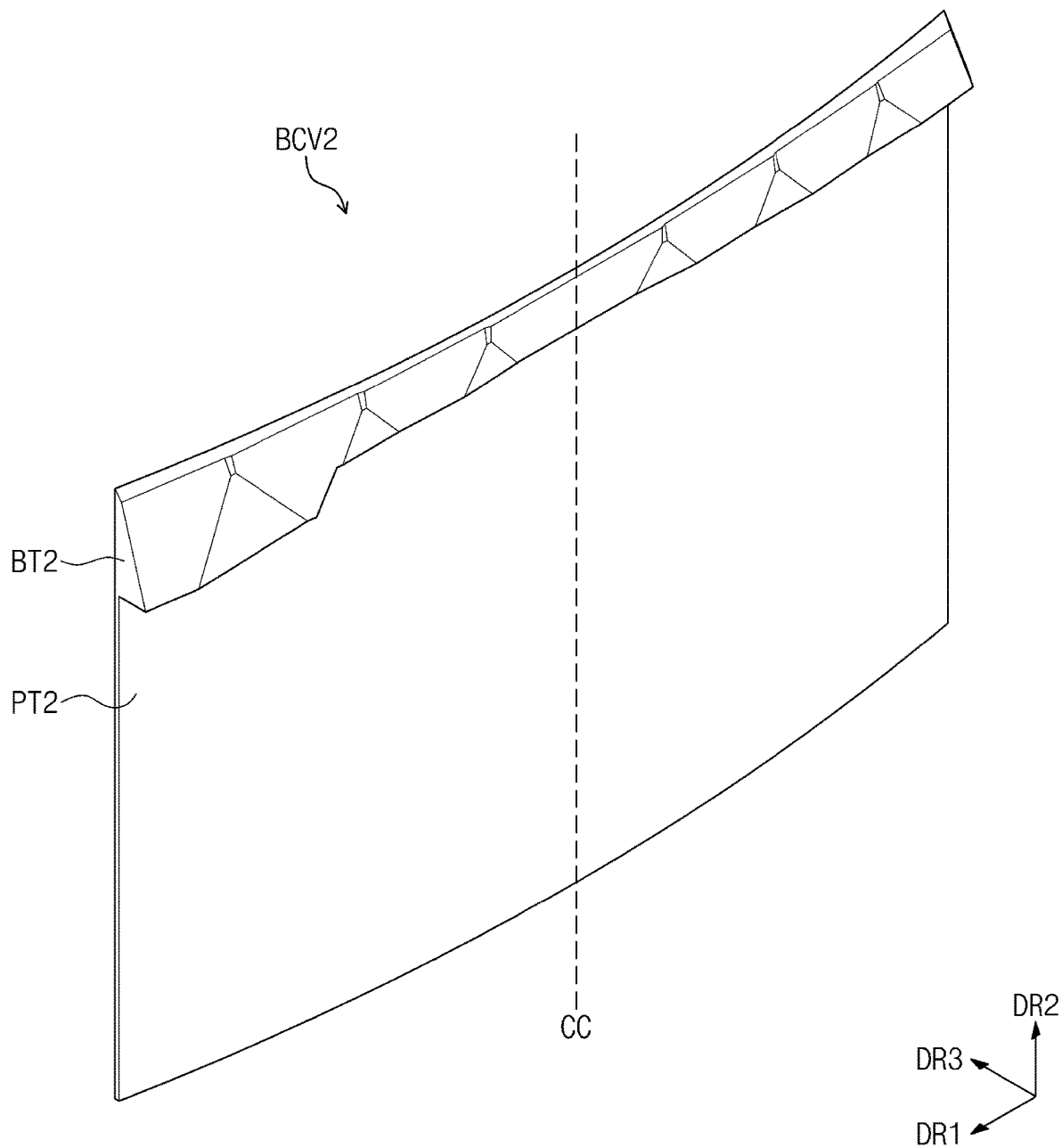
FIG. 12 is a perspective view showing a cover member according to an alternative exemplary embodiment of the disclosure.

FIG. 10 is a block diagram showing a display device according to an alternative exemplary embodiment of the disclosure. FIG. 11 is a plan view showing a main circuit board shown in FIG. 10. FIG. 12 is a perspective view showing a cover member according to an exemplary embodiment of the disclosure.

The display device shown in FIG. 10 may have the same structure and function as those of the display device DD shown in FIG. 2 except for the main circuit board PB. The same or like elements shown in FIG. 10 have been labeled with the same reference characters as used above to describe the exemplary embodiments of the display device shown in FIG. 2, and any repetitive detailed description thereof will hereinafter be omitted or simplified.

Referring to FIGS. 10 and 11, in an exemplary embodiment, a main circuit board PB2 includes a first main area SAa and a second main area SAb. The main circuit board PB2 shown in FIG. 11 has a structure in which the center area CA shown in FIG. 3 is omitted.

In an alternative exemplary embodiment, the main circuit board PB2 may include the center area. In such an embodiment, the main circuit board PB2 may have a structure in which the first main area SAa and the second main area SAb are left-right symmetrical with respect to the center area. In such an embodiment, the second main area SAb may have the same shape as that of the first main area SAa shown in FIG. 7, and the center area may correspond to the second main area SAb shown in FIG. 7.

In an exemplary embodiment, each of the first main area SAa and the second main area SAb of the main circuit board PB2 may include a first main segment, a second main segment, and a sub-segment disposed between the first and second main segments.

In such an embodiment, an area of the sub-segment included in the first main area SAa may be greater than an area of the sub-segment included in the second main area SAb. In such an embodiment, a length of a first bending line BLa included in the first main area SAa may be longer than a length of a third bending line BLc included in the second main area SAb, and a length of a second bending line BLa included in the first main area SAa may be longer than a length of a fourth bending line BLd included in the second main area SAb.

Referring to FIG. 12, a cover member BCV2 may have a shape corresponding to the shape of the main circuit board PB2 shown in FIG. 11.

In an exemplary embodiment, the cover member BCV2 may include a flat portion PT2 and a protruding portion BT2 protruded from the flat portion PT2. The protruding portion BT2 may overlap the main circuit board PB2 and disposed between the rear surface of the display panel DP and the main circuit board PB2. In such an embodiment, a protruding surface of the protruding portion BT2 may have an inclined shape corresponding to the shape of the main circuit board PB2.

In an exemplary embodiment, as described above, the cover member is disposed between the rear surface of the display panel and the main circuit board to fill the space between the display panel and the main circuit board. The shape of the cover member may be changed depending on the shape of the main circuit board.

Figure 13:
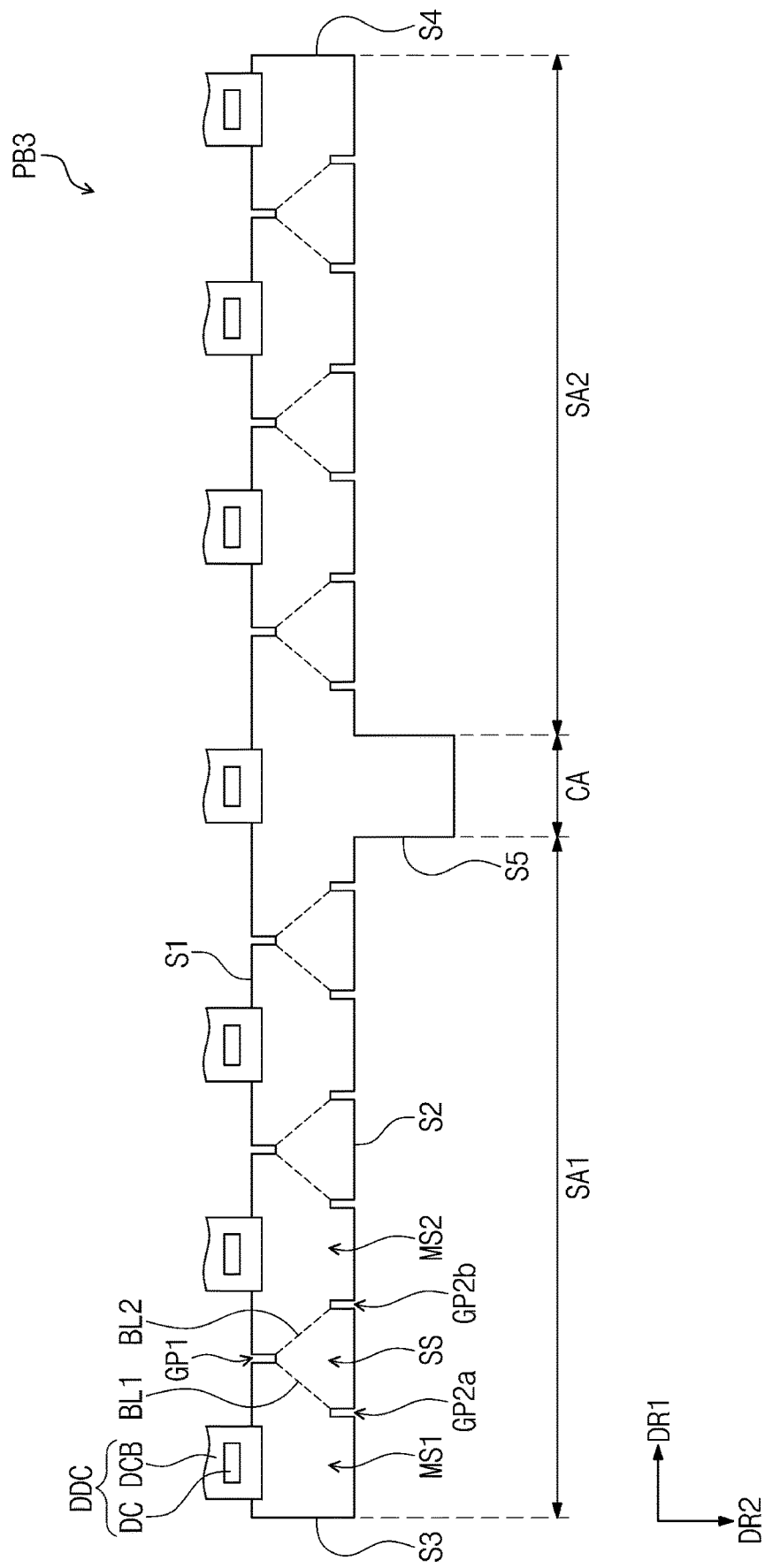
FIG. 13 is a plan view showing a main circuit board according to another alternative exemplary embodiment of the disclosure.

FIG. 13 is a plan view showing a main circuit board according to another alternative exemplary embodiment of the disclosure.

In an alternative exemplary embodiment, as shown in FIG. 13, a main circuit board PB3 may further include a second cut-away portion GP2a and a third cut-away portion GP2b, which are defined therein. In an exemplary embodiment, the second and third cut-away portions GP2a and GP2b are defined in the opposing side portion S2 of the main circuit board PB3 in the first area SA1. In such an embodiment, the second and third cut-away portions GP2a and GP2b may be defined at the opposing side portion S2 of the main circuit board PB3 in the second area SA2 through the same way as the second and third cut-away portions GP2a and GP2b that are defined in the first area SA1.

Referring to FIG. 13, the second cut-away portion GP2a is defined adjacent to the opposing side portion S2 of the main circuit board PB3. The second cut-away portion GP2a may be disposed between a first main segment MS1 and a sub-segment SS.

In such an embodiment, the third cut-away portion GP2b may further defined between a second main segment MS2 and the sub-segment SS of the main circuit board PB3. The third cut-away portion GP2b may be disposed between the second main segment MS2 and the sub-segment SS.

According to an exemplary embodiment, one end of a first bending line BL1 is connected to a first cut-away portion GP1, and the other end of the first bending line BL1 is connected to the second cut-away portion GP2a. One end of a second bending line BL2 is connected to the first cut-away portion GP1, and the other end of the second bending line BL2 is connected to the third cut-away portion GP2b.

In an exemplary embodiment, as described above, the main circuit board PB3 may further include the second cut-away portion GP2a and the third cut-away portion GP2b, which are defined adjacent to the opposing side portion S2, in addition to the first cut-away portion GP1 defined adjacent to the one side portion S1. Accordingly, the tensile force or stress applied to the main circuit board PB3 may be further reduced when the main circuit board PB3 is curved.

Although some exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display device comprising:
   a display panel which is curved and comprising a display surface which displays an image and a rear surface opposed to the display surface;
   a rigid main circuit board facing the rear surface of the display panel, the rigid main circuit board comprises a first main segment, a second main segment, and a first sub-segment disposed between the first main segment and the second main segment; and
   a plurality of flexible printed circuit boards comprising one end connected to the display panel and the other end connected to the rigid main circuit board, respectively, respectively,
   wherein
   a first cut-away portion is defined between the first main segment and the second main segment,
   the first main segment is bent along a first bending line defining a boundary between the first main segment and the first sub-segment, and
   the second main segment is bent along a second bending line defining a boundary between the second main segment and the first sub-segment.

2. The display device of claim 1, wherein the display panel is curved along a center axis of the display panel.

3. The display device of claim 2, wherein
   the first main segment is inwardly bent along the first bending line to be close to the rear surface, and
   the second main segment is outwardly bent along the second bending line to be away from the rear surface.

4. The display device of claim 2, wherein
   the flexible printed circuit boards are disposed at one side portion of the rigid main circuit board, and
   the first cut-away portion is disposed adjacent to the one side portion and disposed between two adjacent flexible printed circuit boards among the flexible printed circuit boards.

5. The display device of claim 4, wherein
   one ends of the first and second bending lines are connected to the first cut-away portions, and
   the other ends of the first and second bending lines are connected to an opposing side portion of the rigid main circuit boards opposite to the one side portion.

6. The display device of claim 5, wherein a distance between the first bending line and the second bending line increases along a direction from the one side portion to the opposing side portion.

7. The display device of claim 4, wherein
   a second cut-away portion is defined between the first main segment and the first sub-segment, and
   a third cut-away portion is defined between the second main segment and the first sub-segment.

8. The display device of claim 7, wherein
   one end and the other end of the first bending line are respectively connected to the first cut-away portion and the second cut-away portion, and
   one end and the other end of the second bending line are respectively connected to the first cut-away portion and the third cut-away portion.

9. The display device of claim 2, wherein the first bending line and the second bending line are left-right symmetrical with each other with respect to the first cut-away portion when viewed in a plan view.

10. The display device of claim 2, wherein
    the rigid main circuit board comprises:
    a first area overlapping the first main segment, the second main segment and the first sub-segment;
    a second area; and
    a center area disposed between the first area and the second area, and
    the rigid main circuit board further comprises a third main segment, a fourth main segment, and a second sub-segment, which overlaps the second area and faces the rear surface.

11. The display device of claim 10, wherein
    the first main segment is inwardly bent along a boundary between the first main segment and the first sub-segment to be close to the rear surface in the first area,
    the second main segment is outwardly bent along a boundary between the second main segment and the first sub-segment to be away from the rear surface in the first area,
    the third main segment is inwardly bent along a boundary between the third main segment and the second sub-segment to be close to the rear surface in the second area,
    the fourth main segment is outwardly bent along a boundary between the fourth main segment and the second sub-segment to be away from the rear surface in the second area, and
    the first and second main segments are left-right symmetrical with the third and fourth segments with respect to the center area.

12. The display device of claim 10, wherein the first sub-segment has an area substantially the same as an area of the second sub-segment when viewed in a plan view.

13. The display device of claim 2, wherein
    a first angle is defined between the first main segment and the first sub-segment due to the bending of the first main segment and the first sub-segment,
    a second angle is defined between the second main segment and the first sub-segment due to the bending of the second main segment and the first sub-segment, and
    the first angle is greater than the second angle.

14. The display device of claim 2, wherein the rigid main circuit board has a T-like shape.

15. A display device comprising:
a display panel;
a main circuit board facing a rear surface of the display panel, the main circuit board comprises a first main segment, a second main segment, and a first sub-segment disposed between the first main segment and the second main segment;
a plurality of flexible printed circuit boards which electrically connects the display panel and the main circuit board; and
a cover member disposed between the rear surface and the main circuit board,
wherein
a first cut-away portion is defined between the first main segment and the second main segment,
the first main segment is bent along a first bending line defining a boundary between the first main segment and the first sub-segment, and
the second main segment is bent along a second bending line defining a boundary between the second main segment and the first sub-segment,
wherein the cover member comprises a flat portion and a protruding portion protruded from the flat portion,
wherein the main circuit board overlaps the protruding portion.

16. The display device of claim 15, wherein
a space is defined between the main circuit board and the rear surface, and
the space is filled with the protruding portion.

17. The display device of claim 15, wherein
the main circuit board comprises a first area, a second area, and a center area defined between the first area and the second area,
each of the first and second areas comprises a first main segment, a second main segment, and a sub-segment, and
a rear surface of a portion of the protruding portion overlapping the first area or the second area is inclined to face the main circuit board.

18. The display device of claim 17, wherein a slope of the rear surface of the portion of the protruding portion overlapping the first main segment is different from a slope of the rear surface of the portion of the protruding portion overlapping the second main segment.

19. The display device of claim 15, further comprising:
an adhesive member disposed between the rear surface and the protruding portion,
wherein the main circuit board is attached to the protruding portion by the adhesive member.

20. The display device of claim 2, wherein
the main circuit board comprises a first area and a second area,
each of the first and second areas comprises a first main segment, a second main segment, and a sub-segment, and
an area of the sub-segment in the first area is different from an area of the first sub-segment in the second area.

21. A display device comprising:
a display panel a display surface which displays an image and a rear surface opposed to the display surface;
a main circuit board separate from and facing the rear surface of the display panel, the main circuit board comprises a first main segment, a second main segment, and a first sub-segment disposed between the first main segment and the second main segment; and
a plurality of flexible printed circuit boards comprising one end connected to the display panel and the other end connected to the main circuit board, respectively,
wherein
a first cut-away portion is defined between the first main segment and the second main segment,
the first main segment is bent along a first bending line defining a boundary between the first main segment and the first sub-segment, and
the second main segment is bent along a second bending line defining a boundary between the second main segment and the first sub-segment,
wherein the first bending line and the second bending line are reflection symmetric with respect to the first cut-away portion on a plane surface defining the first cut-away portion.

* * * * *